(12) United States Patent
Tanaka et al.

(10) Patent No.: US 7,708,473 B2
(45) Date of Patent: May 4, 2010

(54) OPTICAL TRANSCEIVER WITH FRAME GROUND AND SIGNAL GROUND ISOLATED WITH PARALLEL PLATE CAPACITOR

(75) Inventors: Keiji Tanaka, Yokohama (JP); Kenichiro Uchida, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 12/289,034

(22) Filed: Oct. 17, 2008

(65) Prior Publication Data

US 2009/0123116 A1    May 14, 2009

(30) Foreign Application Priority Data

Oct. 22, 2007    (JP) ............... 2007-274169

(51) Int. Cl.
*G02B 6/36* (2006.01)
(52) U.S. Cl. .......................... 385/92; 385/88
(58) Field of Classification Search .................. 385/92
See application file for complete search history.

(56) References Cited

U.S. PATENT DOCUMENTS 7,249,895 B2    7/2007    Diaz

2004/0190835 A1*    9/2004    Burdick et al. ............... 385/89
2007/0237465 A1*    10/2007    Okada ........................ 385/92

FOREIGN PATENT DOCUMENTS

| JP | 2003-283177 | 10/2003 |
|----|-------------|---------|
| JP | 2008-085183 | 4/2008  |

\* cited by examiner

*Primary Examiner*—Sung H Pak
(74) *Attorney, Agent, or Firm*—Smith, Gambrell & Russell, LLP

(57) ABSTRACT

A technique is disclosed for an optical transceiver, where the frame ground is electrically isolated from the signal ground in a low frequency region and is conducted in a high frequency region, without applying a capacitor as a substantial circuit component. The transceiver includes a TOSA whose housing is grounded with the FG and connected with the driver with a FPC board. On the FPC board is formed with a parallel plate capacitor, one conductive pattern on the one surface is connected with the housing of the TOSA, while the other pattern in the opposite surface is connected with the SG. This parallel plate capacitor isolates the FG from the SG in low frequencies, while conducts the FG with the SG in high frequencies.

1 Claim, 4 Drawing Sheets

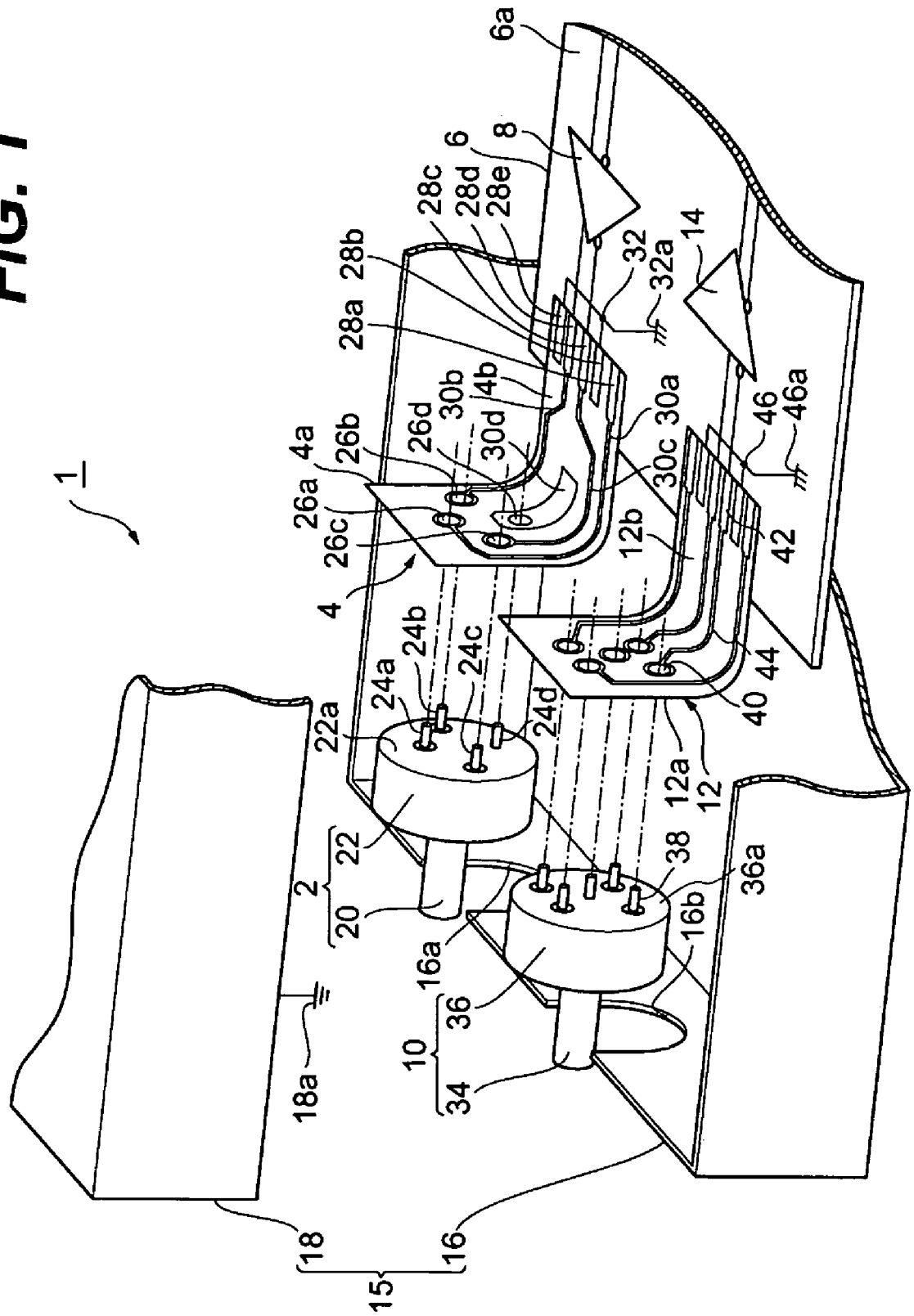

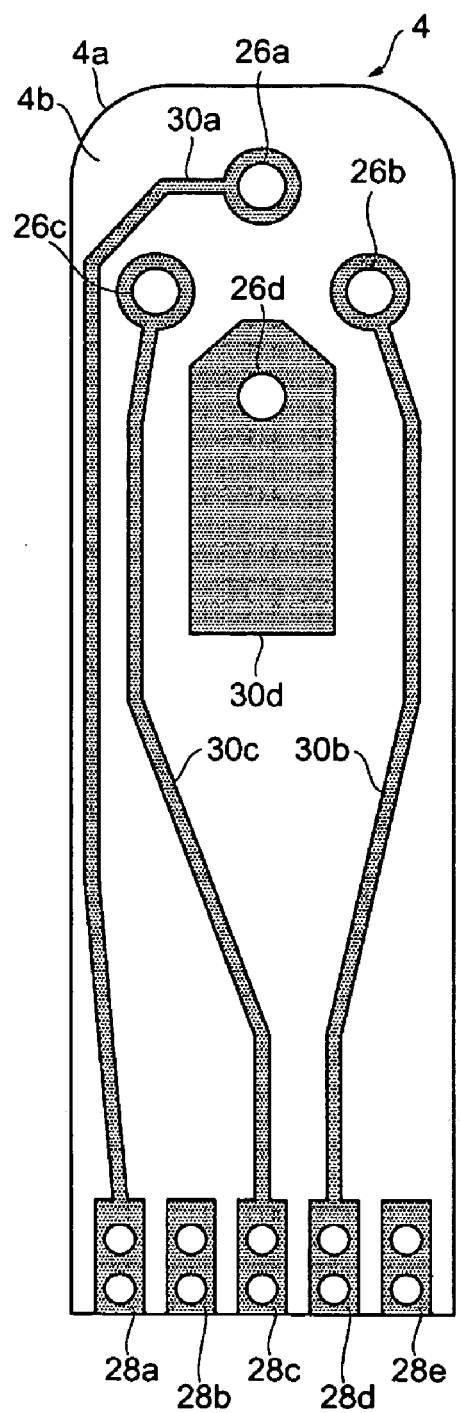
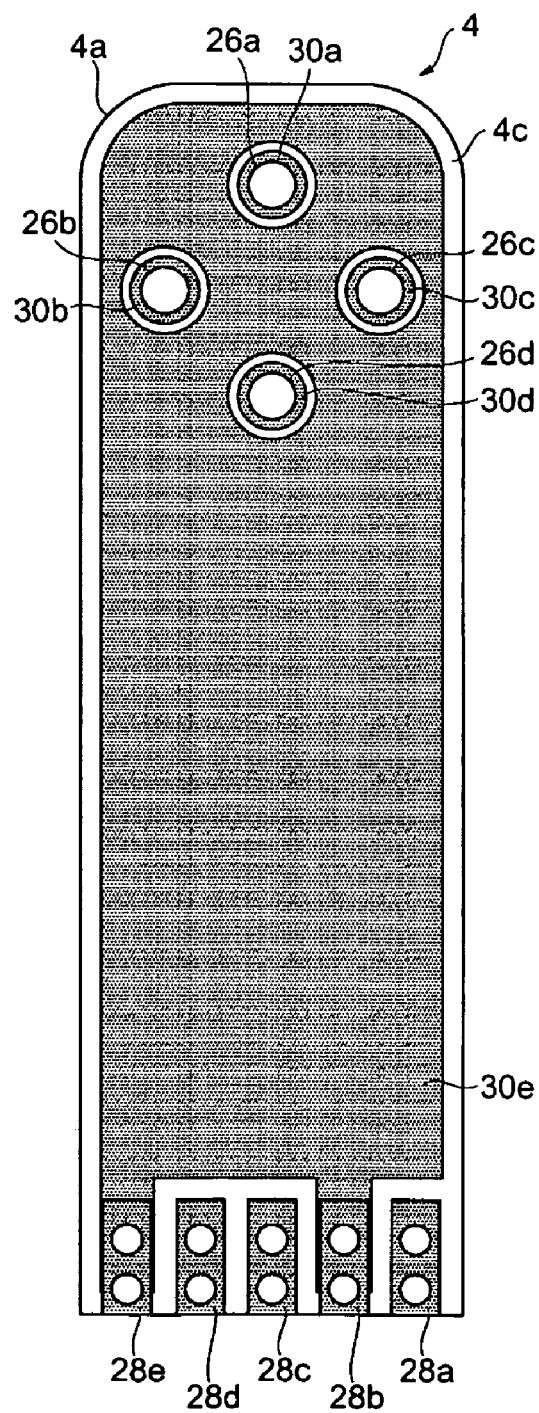
FIG. 2A
FIG. 2B

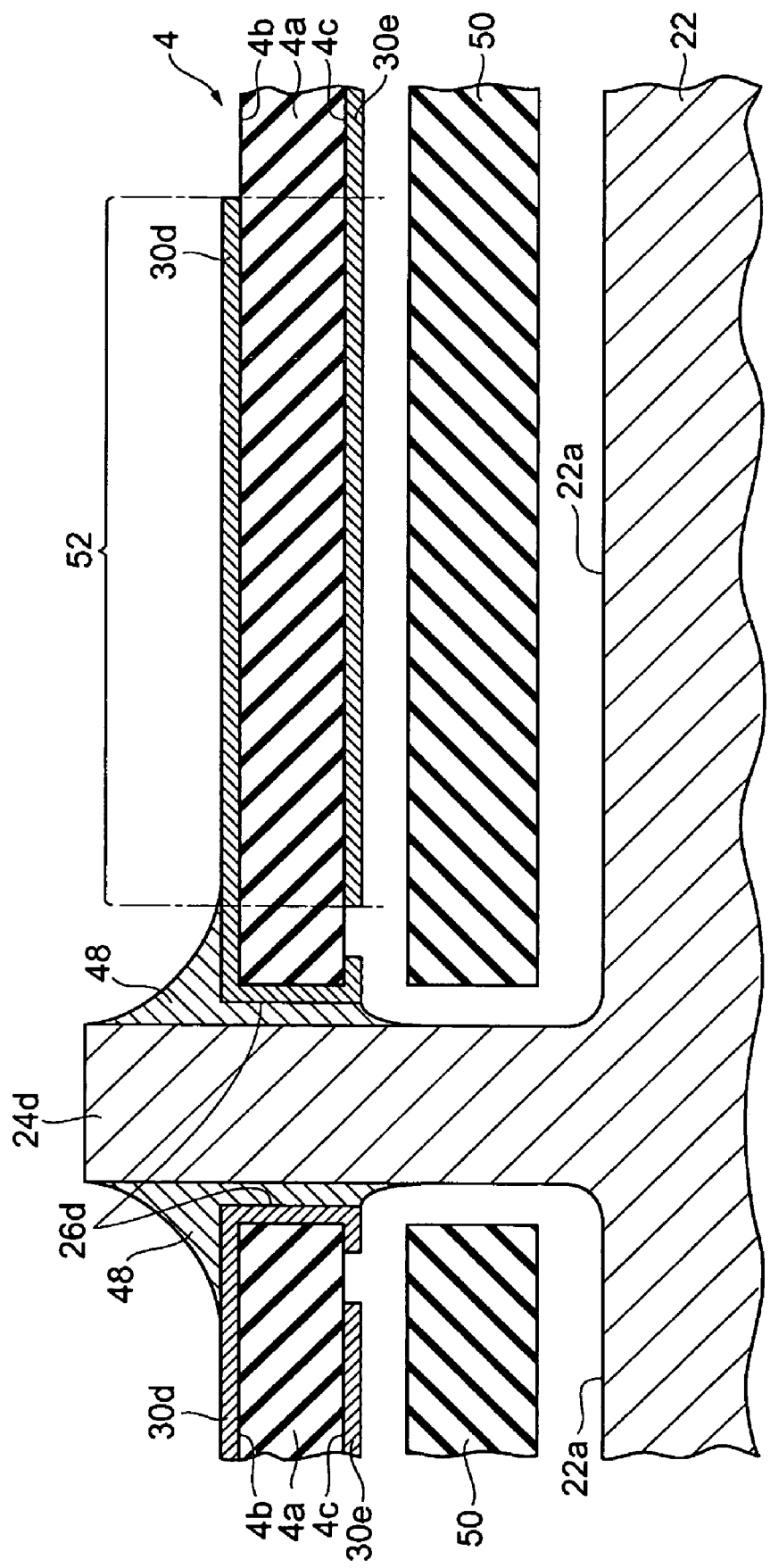

OPTICAL TRANSCEIVER WITH FRAME GROUND AND SIGNAL GROUND ISOLATED WITH PARALLEL PLATE CAPACITOR

BACKGROUND OF THE INVENTION

1. Field of the Invention

The present invention relates to an optical transceiver.

2. Related Prior Arts

It is well known in the field that the ground is divided into the signal ground (hereafter called as SG) and the frame ground (hereafter called as FG), sometimes called as the chassis ground, to reduce the radiation noise. A Japanese patent application published as JP-2003-283177A has disclosed a noise reduction apparatus that provides one of such techniques, where the noise current to be sunk to the FG is reduced by dividing it into two portions and leading one of portions to the SG. This apparatus has a capacitor connected between the SG and the FG. Thus, the noise current is to be flowed from the FG to the SG through the capacitor. In other words, the impedance of the FG at high frequencies may be decreased by the capacitor between two grounds.

The capacitance of the capacitor is necessary to be a several pico-farad (pF) or greater in a range of several giga-hertz (GHz). While, the capacitor is also necessary to have a large isolation voltage at relatively low frequencies. The IEC standard rules that the capacitor used in such an application has an isolation voltage greater than 500 V. It is not practical that a capacitor is able to cope with both the high frequency performance and the large isolation voltage.

The present invention is to provide a technique to decrease the impedance between the FG and the SG as maintaining the isolation tolerance between the grounds without using any capacitor as a circuit component.

SUMMARY OF THE INVENTION

An optical transceiver according to one embodiment of the invention has a feature that: the transceiver includes a metal housing, a transmitter optical subassembly (TOSA), a circuit board, and a flexible printed circuit (FPC) board. The metal housing is electrically connected with the FG. The TOSA includes a device housing made of metal and a laser diode (hereafter denoted as LD) installed within the device housing. The device housing of the TOSA is electrically connected with the metal housing and includes at least one case pin directly and electrically connected with the device housing. The circuit board installs a driver circuit to drive the LD in the TOSA and the SG. The FPC board, which electrically connects the driver circuit with the LD, provides a primary surface and another opposite to the primary surface. The primary surface provides a first conductive pattern, while, the other surface provides a second conductive pattern. In the present optical transceiver, the first conductive pattern is electrically connected with the case pin, while, the second conductive pattern on the other surface of the FPC board is connected with the SG on the circuit board.

Thus, the first and second conductive patterns constitute a parallel plate capacitor that electrically isolates the FG from the SG in low frequencies while that makes the FG substantially in short-circuited with the SG in high frequency regions.

The optical transceiver may further provide an insulating sheet between the FPC board and the device housing of the TOSA. When the other surface of the FPC board faces the device housing, the second conductive pattern is possibly short-circuited with the device housing. By providing the insulating sheet between the device housing and the FPC board, the short circuit between the FG and the SG may be securely prevented.

BRIEF DESCRIPTION OF DRAWINGS

FIG. 1 magnifies a primary section of the optical transceiver according to one embodiment of the invention;

FIGS. 2A and 2B show a FPC board with interconnections and conductive patterns thereon;

FIG. 3 is a cross section of a via hole provided in the FPC board; and

DESCRIPTION OF PREFERRED EMBODIMENTS

Figure 4:
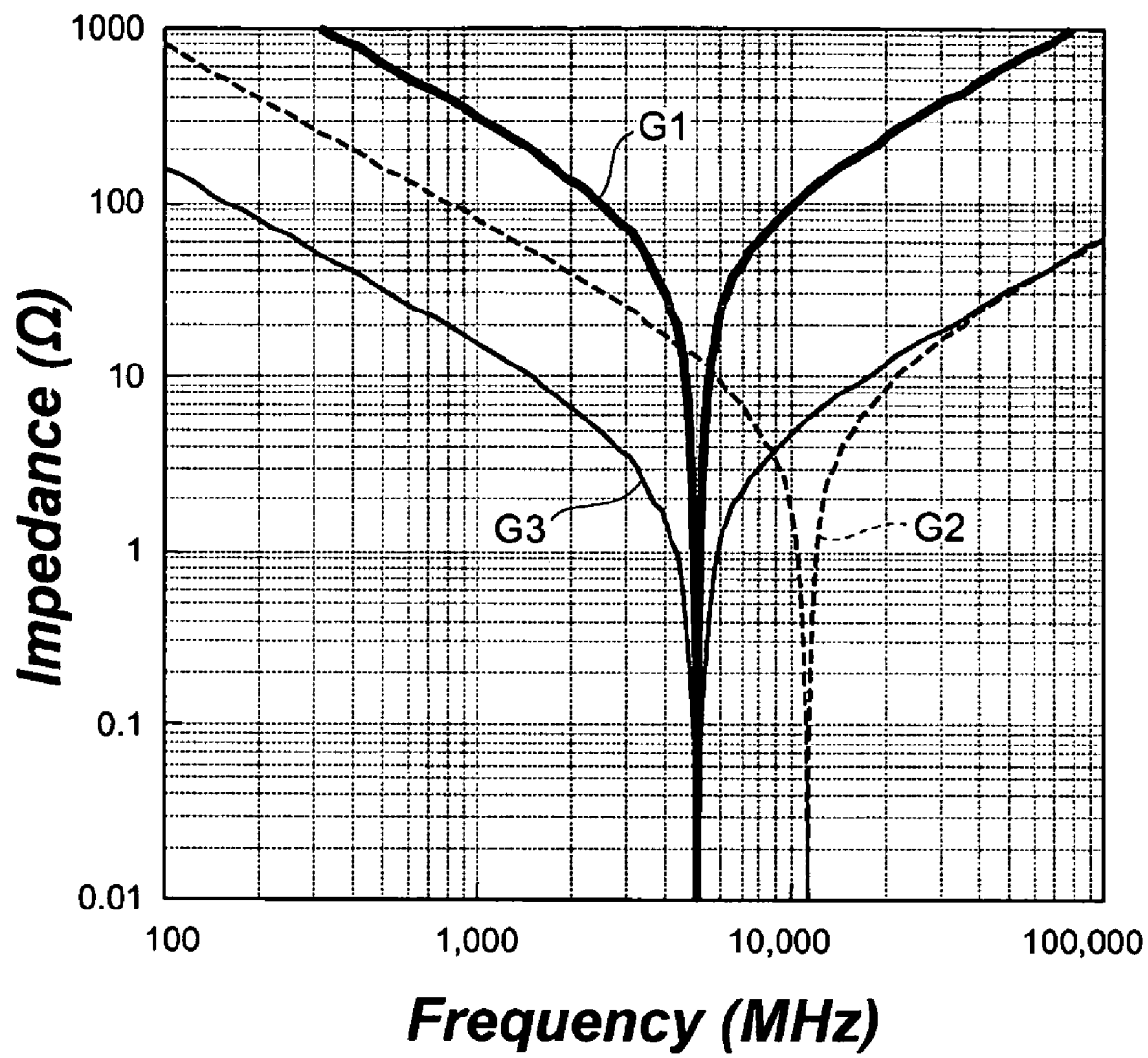
FIG. 4 compares impedance characteristic of the first embodiment and that of the second embodiment with a conventional configuration.

Next, preferred embodiments of the invention will be described as referring to drawings. In the description of the drawings, the same elements will be referred as the same numerals or the same symbols without overlapping explanations. FIG. 1 magnifies a primary section of the optical transceiver according to one embodiment of the invention.

The optical transceiver 1 comprises a transmitter optical sub-assembly (hereafter denoted as TOSA) 2, a flexible printed circuit (hereafter denoted as FPC) board 4, a circuit board 6, an LD driver 8, a receiver optical sub-assembly (hereafter denoted as ROSA) 10, another FPC board 12, a limiting amplifier (hereafter denoted as LIA) 14, and a metal housing 15. This metal housing 15 includes a base 16 and a cover 18. The base 16 and the cover 18, which may be made of metal and is connected to each other to form a space into which the components described above are installed, are grounded in the FG 18a.

The TOSA 2 provides a sleeve 20 and a device housing 22. The LD and a monitor PD are installed within the device housing 22, while the sleeve 20 mates with an optical connector to couple the LD in the device housing with an optical fiber in the optical connector. The sleeve 20 and the device housing are both made of metal and electrically connected with the base 16. Specifically, the sleeve 20 in a root portion thereon is fitted within the U-cutting 16a and another U-cutting provided in the inner wall of the cover 18, which is not illustrated in FIG. 1, puts the sleeve 20 therebetween. Thus, the sleeve 20 and the device housing 22 are grounded in the FG 18a.

The TOSA also provides a plurality of lead pins, 24a to 24d, extending from the bottom surface 22a of the device housing 22, one of which is called as the case pin 24d and is directly and electrically connected with the device housing 22. Accordingly, the case pin 24d is also grounded in the FG 18a. One of lead pins 24a is connected with the anode of the monitor PD within the device housing 22, another lead pin 24b is connected with both the cathode of the monitor PD and the anode of the LD, and the last lead pin 24c is connected with the cathode of the LD.

The first FPC 4 electrically connects the TOSA 2 with the circuit board 6 to provide a driving signal from the circuit board 6 to the LD 2. The FPC 4 provides a base 4a, a shape of which is substantially rectangle. The FPC 4 has a thickness of about 25 μm, an isolating voltage of about 5 kV and a dielectric constant of about 3. The FPC 4 may be made of polyimide.

The FPC 4 will be further explained as referring to FIGS. 2A and 2B. The primary surface 4b of the FPC 4 provides interconnections 30a to 30c and a conductive pattern 30d, while, the back surface 4c provides another conductive pattern 30e extending substantially all over the surface. The FPC 4 further provides via holes, 26a to 26d, into which the lead pins 24a to 24c and the case pin 24d are inserted. Inner wall of the via holes 26a to 26d are covered with respective conductive patterns 30a to 30d, as illustrate in FIG. 3.

The lead pins, 24a to 24c, and the case pin 24d are electrically connected with respective conductive patterns, 30a to 30d, by inserting them into the corresponding via holes, 30a to 30d, and by being soldered.

The FPC 4 further provides pads, 28a to 28e, in a side opposite to an area where the via holes are formed. The pad 28a is connected with the conductive pattern 30a and the pad 28c is connected with the pattern 30c, while, the pad 28d is connected with the pattern 30b. Two pads, 28b and 28e, are connected in one side with the terminal 32 on the circuit board 6 as illustrated in FIG. 1, while, they are connected in the other side with the conductive pattern 30e. Thus, the conductive pattern 30e is grounded in the SG 32a through the pads, 28b and 28e, and the terminal 32.

The circuit board 6 installs the electronic circuit on the primary surface 6a thereof. The circuit includes the LD driver 8, the LIA 14, and the terminals, 32 and 46. The LD driver 8 generates the driving signal that is led to the LD with the device housing 22 of the TOSA 2 through the pads, 28c and 28d, the conductive patterns, 30c and 30b, each provided on the FPC board 4, and the lead pins, 24c and 24b. The SG 32a, also 46a, is the ground for this electronic circuit.

The LIA 14 receives the electric signal output from the ROSA through the FPC 12, amplifies the signal and outputs the amplified signal to the subsequent stage. One of electrical signals is transmitted from the PD within the device housing 36 of the ROSA through the lead pin 38, and the conductive pattern 44 and the pad 42 each formed on the FPC 12. The terminal 32 connects the pads, 28b and 28e, on the FPC 4 with the SG 32a, while, the other terminal 46 connects two pads on the FPC 12 with the SG 46a on the circuit board.

The ROSA 10 comprises the sleeve 34 and the device housing 36. The device housing 36 installs the PD therein, while, the sleeve mates with the optical connector to couple the PD in the housing 34 optically with the optical fiber. Five lead pins 38 are extending from the bottom surface 36a of the device housing 36.

The FPC 12, similar to the forgoing FPC 4, having a base 12a with a substantially rectangular shape, provides six pads 42 and four conductive patterns on the primary surface thereof. The FPC 12 further provides five via holes 40 into which the five lead pins of the ROSA 10 are inserted. The via holes 40, passing from the primary surface 12a to the opposite surface 12b, are covered with the conductive pattern 40 in the inner wall thereof. The lead pins 38 inserted within the via holes 40 are soldered to the conductive patterns 44. Two pads are connected with the terminal 46, which are grounded in the SG 46a, and other two pads are connected with the LIA 14.

Next, the coupling between the FPC 4 and the case pin 24d will be described as referring to FIG. 3. The case pin 24d, which is inserted into the via hole 26d of the FPC 4, is fixed to and is connected with the conductive pattern 30d with the solder 48. Because, the device housing 22 is connected with the FG 18 as mentioned above, and the case pin, which is directly extended from the bottom surface of the housing 22 and is connected with the pattern 30d on the FPC, the pattern 30d becomes the FG.

Between the FPC 4 and the housing 22 is provided with an insulating sheet 50, as illustrated in FIG. 3, with a thickness of 0.1 to 0.5 mm. This insulating sheet 50 electrically isolates the conductive pattern 30e on the FPC 4 from the device housing 22. Thus, the insulating sheet 50 electrically isolates the conductive pattern 30e that is connected with the SG 32a from the pattern 30d connected with the FG 18a.

Moreover, between the patterns, 30d and 30e, is provided with the insulating base 4a, which constitutes a parallel plate capacitor 52 with the capacitance of about 1 pF/mm$^2$ when the thickness of the base is 25 μm and the dielectric constant thereof is about 3. Thus, the pattern 30d is regarded as a substantially short-circuited with the pattern 30e in a gigahertz band, while, the pattern 30d is fully isolated from the pattern 30e in low frequencies.

Because the base 4a has a thickness less than that of the circuit board, typically one-fourth of the latter, the capacitance of the parallel plate capacitor 52 becomes four times larger than a case where the capacitance is formed within the circuit board 6. FIG. 4 compares these two cases. The behavior G1 in FIG. 4 assumes a condition where the lead pins, 24a to 24c, and the case pin 24d are directly connected with the circuit on the circuit board 6 without interposing the FPC 4 and the capacitor is formed between two surfaces of the circuit board 6.

Thus, according to the optical transceiver of the present embodiment, although the current supplied to the LD induces the high frequency noise in the device housing 22, the high frequency noise may be conducted to the SG 32a through the case pin 24d and the capacitor 52, which reduces the noise appeared in the FG 18a. Consequently, the high frequency noise radiated from the transceiver housing 15 may be reduced.

The length of the case pin 24d is about a sum of the thickness of the FPC 4 and the insulating sheet 50. Accordingly, the high frequency noise radiated from a portion of the case pin 24d exposed between the housing 22 and the FPC 4 may be also effectively reduced, which also reduces the crosstalk noise. That is, the receiver section of the transceiver including the ROSA 10 and the LIA 14 processes a week signal, while the transmitter second including the TOSA 2 and the LD driver 8 switches the large current in the high frequency. Accordingly, the current switching in the transmitter section influences the weak signal in the receiver section, which is called as the crosstalk noise. In the present embodiment, as mentioned above, the exposed portion of the case pin 24d is so small that a less influence is appeared in the circuit of the receiver section on the circuit board 6.

The base 4a of the FPC 4 shows an isolation voltage of at least 5 kV for a thickness of about 25 μm. Accordingly, the transceiver 1 may provide the isolation voltage between the FG and the SG satisfactory to the standard ruled by the International Electro-technical Commission (IEC).

Next, equivalent impedance between the FG and the SG will be explained as referring to FIG. 4. In FIG. 4, the horizontal axis denotes the frequency in the mega-hertz unit, while, the vertical axis corresponds to the equivalent impedance between two grounds. The behavior G1 in FIG. 4 is a comparative example, the G2 corresponds to the embodiment of the present invention, and the G3 corresponds to the other embodiment of the invention.

The behavior G1 assumes a case where the lead pins of the housing and the case pin are directly connected with the circuit board without interposing the FPC and the capacitor with the parallel plate configuration is formed within the circuit board. The case pin is directly connected with one of the conducting pattern of the capacitor, namely, one of the surfaces of the circuit board, while the other conductive patter in the other surface is grounded to the SG. Thus, the case for the behavior G1 constitutes the impedance circuit by the case pin and the capacitor in the circuit board. This impedance circuit makes the FG in short-circuit with the SG in high frequencies.

The electrode of the capacitor for the G1 is about 2 mm$^2$ whose capacitance is about 0.5 pF. The base pin shows a substantial exposed length between the housing and the circuit board whose inductance becomes about 2 nH or strongly depending on the length thereof. In such a condition, the resonance frequency derived from the capacitance and the inductance above becomes about 5 GHz and the impedance of this circuit behaves as G1 in FIG. 4.

For the behavior G2 corresponding to the first embodiment of the invention, the case pin 24d is coupled with the circuit board 6 through the FPC 4, in which the inductance inherently attributed with the case pin 24d and capacitor 52 in the FPC 4 constitutes a resonance circuit. The FG is connected with the SG through this resonance circuit.

The electrode of the capacitor 52 in the first embodiment is about 2 mm$^2$, whose capacitance becomes about 2 pF. The length of the case pin 24d is far shorter than a case mentioned above and the inductance thereof shows only about 0.1 nH. Accordingly, the resonance frequency of this embodiment becomes about 10 GHz, and the impedance thereof behaves as G2.

Finally, another embodiment will be described. The case pin of this embodiment is also connected with the circuit board through the capacitor 52 on the FPC 4 to constitute a resonance circuit. The area of the electrode of the capacitor 52 is widened to 3.3×3.3 mm$^2$ to shows the capacitance of about 10 pF. While, the length of the case pin 24d is substantially same with the case of the first embodiment, whose inductance is about 0.1 nH. In this case, the resonance frequency becomes about 5 GHz similar to the comparative example G1.

In FIG. 4, the decrease of the impedance as the frequency closes the resonance frequency in a lower frequency side is due to the capacitance on the FPC or that on the circuit board, while, the increase of the impedance as the frequency becomes apart from the resonance frequency in a higher frequency side is due to the inductance of the case pin 24d.

As shown in FIG. 4, the impedance of the behavior G2 is less than that of G1 except for a close range around the resonance frequency (5 GHz), and that of G3 is less than G1 in a whole range of the frequency. Moreover, the behaviors of G2 and G3 becomes enough large in low frequency regions, in particular, they exceeds several kilo ohms in a range below 1 kHz, which securely shows the isolation voltage over 5 kV.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. An optical transceiver, comprising:
   a metal housing electrically connected with a frame ground;
   a transmitter optical subassembly including a device housing made of metal and a laser diode installed within said device housing, said device housing being electrically connected with said metal housing and including at least a case pin directly and electrically connected with said device housing;
   a circuit board that installs a driver circuit to drive said laser diode and a signal ground;
   a flexible printed circuit board that electrically connects said driver circuit to said laser diode, said flexible printed circuit board providing a first conductive pattern formed in a first surface of said flexible printed circuit board and a second conductive pattern formed in a second surface opposite to said first surface, said second surface facing said device housing of said transmitter optical subassembly;
   an insulating sheet provided between said second surface of said flexible printed circuit board and said device housing,
   wherein said first conductive pattern is electrically connected with said case pin and said second conductive pattern is electrically connected with said signal ground on said circuit board, and
   wherein said first conductive pattern and said second conductive pattern form a parallel plate capacitor, and said case pin and said parallel plate capacitor form a resonance circuit with a resonance frequency greater than 1 GHz.

* * * * *